United States Patent
Hayes et al.

(10) Patent No.: US 11,366,024 B2
(45) Date of Patent: Jun. 21, 2022

(54) RESISTANCE MEASUREMENT AND CURRENT CONTROL

(71) Applicant: EVONETIX LTD, Little Chesterford (GB)

(72) Inventors: Matthew James Hayes, Little Chesterford (GB); Vasile Dan Juncu, Little Chesterford (GB)

(73) Assignee: EVONETIX LTD, Cambridge (GB)

( * ) Notice: Subject to any disclaimer, the term of this patent is extended or adjusted under 35 U.S.C. 154(b) by 494 days.

(21) Appl. No.: 16/338,804

(22) PCT Filed: Oct. 4, 2017

(86) PCT No.: PCT/GB2017/052972
§ 371 (c)(1),
(2) Date: Apr. 2, 2019

(87) PCT Pub. No.: WO2018/083437
PCT Pub. Date: May 11, 2018

(65) Prior Publication Data
US 2019/0219452 A1    Jul. 18, 2019

(30) Foreign Application Priority Data
Nov. 1, 2016  (GB) ..................... 1618398

(51) Int. Cl.
*G01K 7/16* (2006.01)
*G01K 1/02* (2021.01)
(Continued)

(52) U.S. Cl.
CPC ............. *G01K 7/16* (2013.01); *G01K 1/026* (2013.01); *G01R 1/203* (2013.01); *G01R 27/14* (2013.01); *G01K 17/16* (2013.01); *G01K 2213/00* (2013.01)

(58) Field of Classification Search
CPC .............. G11C 13/004; G11C 2213/72; G11C 2213/19; G11C 2213/78;
(Continued)

(56) References Cited

U.S. PATENT DOCUMENTS 3,170,147 A * 2/1965 Kurtgruensfelder .................
G11C 11/06014
365/225.5
4,752,694 A    6/1988 Hegel, Jr. et al.
(Continued)

FOREIGN PATENT DOCUMENTS

CN    1407557 A  *  4/2003  ......... G11C 11/1673
CN    100419909 C  *  9/2008  ............. G11C 11/22
(Continued)

OTHER PUBLICATIONS

International Search Report and Written Opinion of the ISA for PCT/GB2017/052972, dated Dec. 8, 2017, 11 pages.
(Continued)

*Primary Examiner* — Gail Kaplan Verbitsky
(74) *Attorney, Agent, or Firm* — Nixon & Vanderhye P.C.

(57) ABSTRACT

A technique for measuring the resistance of a resistive element 4 in the presence of a series diode is provided. By supplying three different currents $I_1$, $I_2$, $I_3$ and measuring corresponding voltages $V_1$, $V_2$, $V_3$ across the resistive element and diode, the voltages can be combined to at least partially eliminate an error in the measured resistance of the resistive element caused by a voltage drop across the diode. A technique for current control in an array of resistive elements is also described in which a column of resistive elements is provided with two or more current sources switched so that while one current source is providing
(Continued)

There are parasitic paths without the series diodes

No parasitic paths when adding series diodes current to the column line corresponding to a selected resistive element, another current source has its amount of current adjusted.

13 Claims, 10 Drawing Sheets

(51) Int. Cl.
   *G01R 1/20* (2006.01)
   *G01R 27/14* (2006.01)
   *G01K 17/16* (2006.01)
(58) Field of Classification Search
   CPC ........ G11C 2013/0045; G11C 13/0023; G11C 2213/77; G11C 11/4067; G11C 2211/4016; G11C 11/1653; G01K 7/16; G01K 1/026; G01K 17/16; G01K 213/00; G01R 1/203; G01R 27/14
   USPC .................. 374/170, 178, 183, 185
   See application file for complete search history.

(56) References Cited

U.S. PATENT DOCUMENTS

| | | | |
|---|---|---|---|
| 6,674,623 B1* | 1/2004 | Abe | G06F 1/206 |
| | | | 257/E23.08 |
| 6,870,357 B1* | 3/2005 | Falik | G01K 15/00 |
| | | | 324/71.5 |
| 7,309,157 B1 | 12/2007 | Aslan et al. | |
| 9,222,843 B2* | 12/2015 | Schnaitter | G01K 7/01 |
| 9,305,624 B2* | 4/2016 | Shepard | H01L 27/105 |
| 9,368,201 B2* | 6/2016 | Park | G11C 11/5678 |
| 10,768,018 B2* | 9/2020 | Astley | G01J 5/20 |
| 2004/0032760 A1* | 2/2004 | Baker | G11C 13/0061 |
| | | | 365/148 |
| 2005/0068830 A1* | 3/2005 | Eaton | G11C 11/16 |
| | | | 365/222 |
| 2006/0193370 A1* | 8/2006 | St. Pierre | G01K 7/01 |
| | | | 374/178 |
| 2009/0116309 A1* | 5/2009 | Hanzawa | G11C 7/1072 |
| | | | 365/189.15 |
| 2010/0214820 A1* | 8/2010 | Hosono | G11C 13/0011 |
| | | | 365/148 |
| 2010/0238701 A1* | 9/2010 | Tsukamoto | G11C 16/3413 |
| | | | 365/226 |
| 2011/0032746 A1* | 2/2011 | Maejima | G11C 13/004 |
| | | | 365/148 |
| 2011/0268151 A1* | 11/2011 | Hadwen | B01L 3/502792 |
| | | | 374/141 |
| 2011/0310662 A1* | 12/2011 | Scheuerlein | G11C 11/21 |
| | | | 365/163 |
| 2012/0098390 A1* | 4/2012 | Takahashi | H03H 9/1035 |
| | | | 310/348 |
| 2012/0207190 A1 | 8/2012 | Trampitsch | |
| 2014/0010023 A1* | 1/2014 | Park | G11C 13/004 |
| | | | 365/189.02 |
| 2014/0092939 A1* | 4/2014 | Chang | G01K 15/005 |
| | | | 374/178 |
| 2014/0226417 A1* | 8/2014 | Lai | G11C 13/004 |
| | | | 365/189.09 |
| 2015/0364187 A1* | 12/2015 | Kim | G11C 11/1675 |
| | | | 365/148 |

FOREIGN PATENT DOCUMENTS

| | | | | |
|---|---|---|---|---|
| GB | 2555527 A | * | 5/2018 | ............. G01K 1/026 |
| JP | S61-54412 | | 3/1986 | |
| JP | 8-304188 | | 11/1996 | |
| JP | 2004134472 A | * | 4/2004 | ............... G01K 7/01 |

OTHER PUBLICATIONS

Search Report for GB1618398.0, dated Mar. 10, 2017, 4 pages.
"Shockley diode equation", Wikipedia, https://en.wikipedia.org/wiki/Shockley_diode_equation , retrieved Mar. 16, 2017, 4 pages.

* cited by examiner

RESISTANCE MEASUREMENT AND CURRENT CONTROL

This application is the U.S. national phase of International Application No. PCT/GB2017/052972 filed 4 Oct. 2017, which designated the U.S. and claims priority to GB Patent Application No. 1618398.0 filed 1 Nov. 2016, the entire contents of each of which are hereby incorporated by reference.

The present technique relates to the field of electronics.

A resistive element can be used for a variety of purposes in an electronic circuit. For example, one use is as a temperature sensor, exploiting the variation in resistance with temperature. Another is as a resistive heater, where passing a current through the resistive element generates heat.

At least some examples provide an apparatus comprising:
a resistive element and a diode arranged in series;
current control circuitry configured to switch a current supplied to the resistive element and the diode between a first current $I_1$, a second current $I_2$ and a third current $I_3$, where $I_1 > I_2 > I_3$; and
measuring circuitry configured to determine a resistance R of the resistive element in dependence on a first voltage $V_1$ across the resistive element and the diode when the first current $I_1$ is supplied, a second voltage $V_2$ across the resistive element and the diode when the second current $I_2$ is supplied, and a third voltage $V_3$ across the resistive element and the diode when the third current $I_3$ is supplied;
wherein the measuring circuitry is configured to combine the first voltage $V_1$, the second voltage $V_2$ and the third voltage $V_3$ to at least partially eliminate an error in the determined resistance R of the resistive element caused by a voltage drop across the diode At least some examples provide a method for measuring a resistance R of a resistive element arranged in series with a diode; the method comprising:
switching a current supplied to the resistive element and the diode between a first current $I_1$, a second current $I_2$ and a third current $I_3$, where $I_1 > I_2 > I_3$; and
determining the resistance R of the resistive element in dependence on a first voltage $V_1$ across the resistive element and the diode when the first current $I_1$ is supplied, a second voltage $V_2$ across the resistive element and the diode when the second current $I_2$ is supplied, and a third voltage $V_3$ across the resistive element and the diode when the third current $I_3$ is supplied;
wherein the resistance R is determined by combining the first voltage $V_1$, the second voltage $V_2$ and the third voltage $V_3$ to at least partially eliminate an error in the determined resistance R of the resistive element caused by a voltage drop across the diode.

At least some examples provide an apparatus comprising:
an array of resistive elements arranged in rows and columns, wherein each resistive element is individually addressable at an intersection between a corresponding row line and a corresponding column line;
current control circuitry comprising a plurality of current sources each configured to supply a variable amount of current, and switching circuitry configured to select which of the plurality of current sources is coupled to a selected column line corresponding to a selected column of resistive elements; and
timing control circuitry configured to control the current control circuitry to adjust the amount of current supplied by one of the current sources while another of the current sources is coupled to the selected column line.

At least some examples provide a method for controlling current supply for an array of resistive elements arranged in rows and columns, wherein each resistive element is individually addressable at an intersection between a corresponding row line and a corresponding column line;
the method comprising:
selecting which of a plurality of current sources is coupled to a selected column line corresponding to a selected column of resistive elements, each current source supplying a variable amount of current; and
adjusting an amount of current supplied by one of the current sources while another of the current sources is coupled to the selected column line.

Further aspects, features and advantages of the present technique will be apparent from the following description of examples, which is to be read in conjunction with the accompanying drawings, in which.

Figure 1:
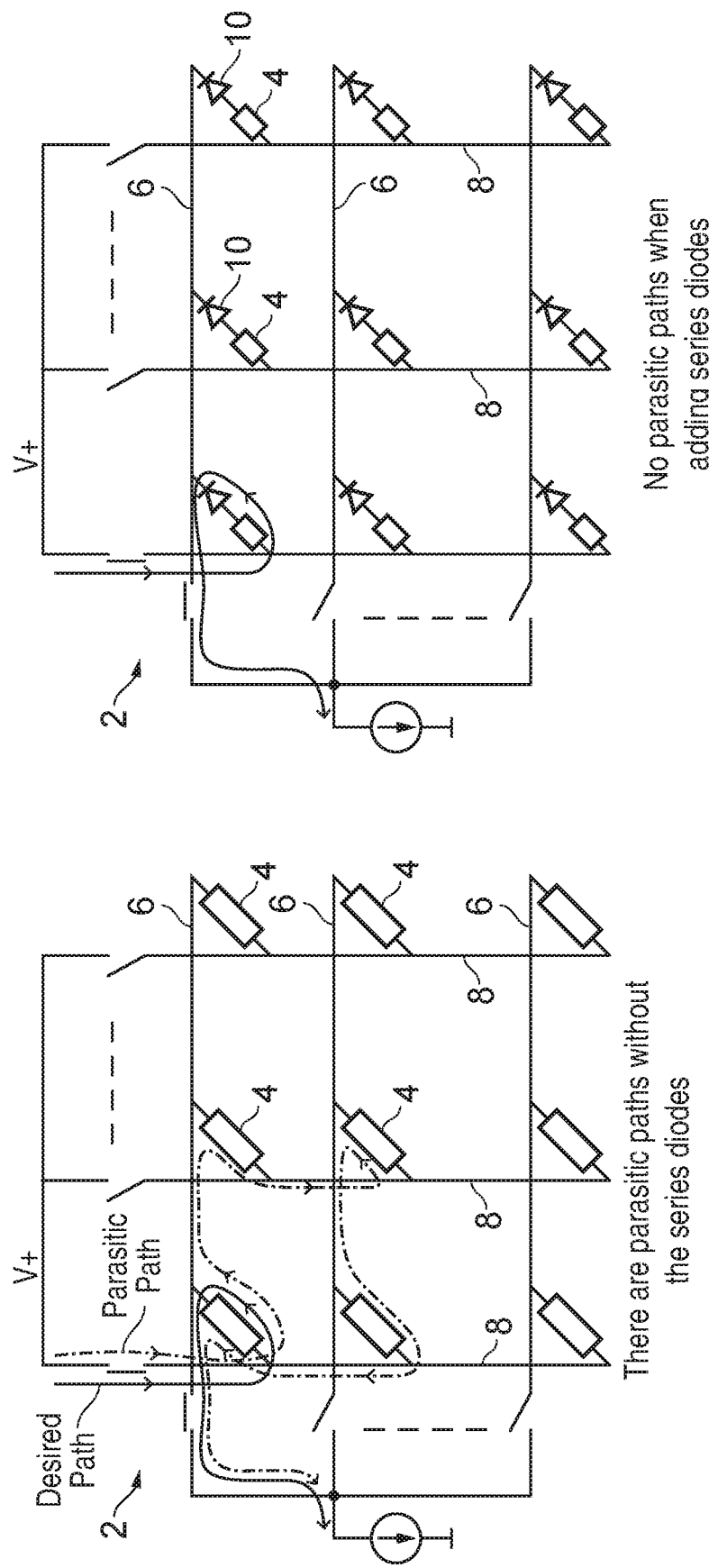
FIG. 1 illustrates an example of an array of resistive elements in series with diodes.

Temperature measurement can be made using a component whose resistance changes as a function of temperature. This approach is more accurate than the alternative of measuring the thermal voltage of a diode, particularly when platinum resistors are used. Although there are many different circuit topologies used for resistance measurement, they share the principle of setting a current through the unknown resistance and measuring the voltage drop across it. However, this principle ceases to function where there is an unknown voltage drop in series with the resistance, such as that caused by a diode. As diodes are often required to control the direction of current flow, particularly in matrix applications, this limits the applicability of resistive temperature sensors.

However, the inventors recognised that by using three different levels of current supplied to the resistive element and the diode, the resistance of the resistive element can be measured more accurately even in the presence of the diode. Current control circuitry may be provided to switch a current supplied to the resistive element and the diode between a first current $I_1$, a second current $I_2$ and a third current $I_3$, where $I_1 > I_2 > I_3$. Measuring circuitry is provided to determine a resistance R of the resistive element in dependence on first, second and third voltages $V_1$, $V_2$, $V_3$ measured across the resistive element and the diode when the first, second and third currents are supplied respectively. The measuring circuitry combines the voltages $V_1$, $V_2$, $V_3$ to at least partially eliminate an error in the determined resistance R of the resistive element caused by a voltage drop across the diode.

The ratio between the first current $I_1$ and the second current $I_2$ may be substantially the same as a ratio between the second current $I_2$ and the third current $I_3$. This exploits a logarithmic relationship between current and voltage drop in the diode, which means that when a common ratio is used for $I_1/I_2$ and $I_2/I_3$, the voltages $V_1$, $V_2$, $V_3$ can be combined by addition and subtraction to fully or partially cancel out the term representing the voltage drop. In particular, the measuring circuitry may determine the resistance R of the resistive element proportional to $V_1 - 2V_2 + V_3$.

Preferably, the ratio between currents $I_1/I_2$ and the ratio between currents $I_2/I_3$ may be equal. That is, the currents may satisfy $I_2 = yI_1$ and $I_3 = y^2 I_1$, where y represents the common ratio between the currents and $1 > y > 0$. Providing exactly the same ratio between currents $I_1/I_2$ as between currents $I_2/I_3$ can provide the most accurate measurement of the resistance R of the resistive element, because this allows more complete cancellation of the terms dependent on the diode voltage drop.

However, in practice due to the finite tolerance with which the currents $I_1$, $I_2$, $I_3$ are able to be controlled by a current source, the ratios between currents $I_1/I_2$ and currents $I_2/I_3$ may not be exactly the same. Even if the ratios are not the same and so the terms depending on the diode voltage drop do not completely cancel when combining the voltages $V_1$, $V_2$, $V_3$, the present technique can still provide partial elimination of the effect of the diode on the resistance measurement, so that the error in the resistance measurement may be several orders of magnitude smaller than if the resistance is simply measured by passing a single current through the resistive element and diode and dividing the voltage across the resistive element and diode by the amount of current. Hence, the ratio of the first current $I_1$ to the second current $I_2$ may be substantially the same as the ratio of the second current $I_2$ to the third current $I_3$ in the sense that $I_2 = yI_1$ and $I_3 = y(y \pm \Delta)I_1$, where $\Delta$ represents the tolerance in the difference in ratios. For example, $\Delta$ may be less than 5% of y, or less than 10% of y, depending on the implementation.

There may be a range of possible circuit implementations for implementing the measuring circuit which combines the voltages $V_1$, $V_2$, $V_3$ to generate an indication of the determined resistance R. For example, the voltages $V_1$, $V_2$, $V_3$ measured at each of the three currents $I_1$, $I_2$, $I_3$ could each be passed to an analogue-to-digital converter (ADC) to generate three digital values respectively representing the first, second and third voltages $V_1$, $V_2$, $V_3$, and then the digital values could be passed to an arithmetic circuit which may calculate the resistance R according to $V_1 - 2V_2 + V_3$ as discussed above. However, this approach would require three separate analogue-to-digital conversions, each introducing quantisation noise, and so this would result in the resistance R having a greater amount of quantisation noise relative to the signal compared to the simple case of measuring resistance according to V/I in the absence of a diode. Accordingly, the ADC may need to have a greater number of bits of resolution to compensate for the increased noise, increasing circuit area and manufacturing cost.

In another example, the measuring circuitry may comprise an ADC configured to generate a digital value representing the determined resistance R of the resistive element in dependence on the first voltage $V_1$, second voltage $V_2$, and third voltage $V_3$ detected during a single sampling period of the ADC. The combination of the first, second and third voltages may be performed using analogue circuitry rather than digital circuitry, to reduce the quantisation noise in the measured resistance value by using only a single A/D conversion.

For example, the measuring circuitry may comprise a filter configured to receive a pair of differential inputs indicative of the voltage across the resistive element and the diode, which generates an output signal representing an integral of the voltage represented by the differential inputs over time. For example, the filter may be a low-pass filter. While a single-ended filter could be used, it can be preferable for the filter to be a fully differential low-pass filter, so that the output signal comprises a pair of differential outputs, because this can avoid accumulation of errors due to charge injection. By using an integrating filter, the cumulative voltage detected over the period of time when the respective currents $I_1$, $I_2$, $I_3$ are supplied can be determined, and the filter can generate an output signal which corresponds to the combination of the voltages $V_1$, $V_2$, $V_3$.

A switch may be provided to select one of a first configuration and a second configuration in which a polarity of the pair of differential inputs of the filter is reversed compared to the first configuration. For example, the switch may be a cross-bar switch which switches between a first configuration where a first differential input of the filter is coupled to a first signal node on one side of the resistive element and diode and a second differential input of the filter is coupled to a second signal node on the other side of the resistive element and diode, and a second configuration in which the first differential input is coupled to the second signal node and the second differential input is coupled to the first signal node. By providing a switch for reversing the polarity of the differential inputs of the filter, this allows the integration of the filter to implement subtraction as well as addition, to enable the filter to combine the voltages $V_1$, $V_2$, $V_3$ in the desired relation for eliminating the effect of the diode.

Timing control circuitry may be provided to control the switch to select the first configuration when the first current $I_1$ or the third current $I_3$ is supplied to the resistive element and the diode, and to select the second configuration when the second current $I_2$ is supplied to the resistive element and the diode. Hence, by ensuring that the polarity of the inputs is in the opposite state for the second current compared to the first and third currents, this allows the output of the filter to correspond to the combination $V_1 - 2V_2 + V_3$ as explained above.

Also, the relative timings for which the respective currents are supplied may be varied to control the weights with which the voltages $V_1$, $V_2$, $V_3$ are combined by the filter. Timing control circuitry may be provided to control the current control circuitry to supply the first current to the resistive element and the diode in a first time period of duration t, to supply the second current to the resistive element and the diode in a second time period of duration 2 t, and to supply the third current to the resistive element and the diode in a third time period of duration t. By supplying the second current $I_2$ for twice as long as the first and third currents $I_1$, $I_3$, this means the output of the filter corresponds to the relation $V_1-2V_2+V_3$ described above.

When such a filter is used, an ADC may be provided downstream of the filter to generate a digital value representing the resistance R of the resistive element in dependence on the output signal of the filter. Gain may be applied between the filter and ADC in some examples to increase the signal level. The timing control circuitry may control the current control circuitry to switch between the first current, the second current and the third current at a greater frequency than a sampling rate of the ADC, so that one sample of the ADC corresponds to the combination of voltages $V_1$, $V_2$, $V_3$ representing the measured resistance R with reduced dependency on the diode voltage drop.

First, second and third current sources may be provided to generate the first current $I_1$, second current $I_2$, and third current $I_3$ respectively. Each current source may include a closed-loop feedback circuit configured to control a voltage across a reference resistive element according to a common reference voltage, wherein the reference resistive elements of the first, second and third current sources have different resistances. Using closed-loop techniques with a common reference voltage can provide more accurate control of the three currents. Hence, the ratios between the respective currents may effectively be set by the ratios between the reference resistances in the respective current sources.

In one example, the current control circuitry may comprise first, second and third switching circuits each corresponding to a respective one of the current sources. At any given time, one of the first, second and third switching circuits may couple its current source to the resistive element and the diode, while the other current sources are isolated from the resistive element and the diode. However, in order for the closed-loop control to settle, a dummy load may be provided so that current from a given current source can be steered to the dummy load when that current source is not driving the resistive element and diode. Hence, each of the first, second and third switching circuits may select whether a current from the corresponding one of the first, second and third current sources is directed to the resistive element and the diode or to the dummy load.

The technique described above can be used for any application in which it is desired to measure resistance of a resistive element in the presence of a series diode. However, it is particularly useful when the resistive element is being used as a temperature sensor so that the resistance value R is used as an indication of temperature T.

In some cases, the resistive element whose resistance is being measured may be the only resistive element. Alternatively, the apparatus may comprise multiple resistive elements, each having a diode connected in series with it, whose resistance may need to be measured. For example, an array of temperature sensors may be provided. In this case, it is possible that each resistive element may have its own current control circuit and measuring circuit, or alternatively some resistive elements may share a current control circuit and measuring circuit to reduce the amount of circuitry.

One efficient way of sharing the current control circuit and measuring circuit between resistive elements may be to provide an array of resistive elements arranged in rows and columns, wherein each resistive element is individually addressable via a corresponding row line and a corresponding column line and is arranged in series with a diode between the corresponding row line and the corresponding column line. For example, the current control circuitry may be shared between all the resistive elements in the same column, and the measuring circuitry may be shared between all the resistive elements in the same row. The present technique is particularly useful for an array of resistive elements arranged in a matrix of rows and columns, because diodes may be used in such an array to prevent parasitic paths, and so it is useful to provide a technique for more accurately measuring the resistance of the resistive element despite the presence of the diode.

Another issue when providing an array of individually addressable resistive elements arranged in rows and columns may be the control of current supplied to a given column. For example, the resistive elements could be resistive heaters which may need to be supplied with different currents in order to provide different amounts of heating at different locations of the array. To reduce the amount of control circuitry provided, a column of resistive elements may share current control circuitry for driving the resistive elements. However, if different currents need to be supplied at different rows within the column, this may require relatively fast switching between different current levels. In practice, it is difficult to provide a current source which switches its current level both accurately and fast, and so providing a single current source per column may limit one or both of the accuracy with which current can be controlled and the frequency with which currents can be changed for different rows in the column.

This problem can be addressed by providing current control circuitry comprising two or more current sources each configured to supply a variable amount of current, and switching circuitry configured to select which of the plurality of current sources is coupled to a selected column line corresponding to a selected column of resistive elements. Timing control circuitry can be provided to control the current control circuitry to adjust the amount of current supplied by one of the current sources while another of the current sources is coupled to the selected column line. Hence, by providing multiple current sources for the same column of the array, the control circuitry may alternate which current source is used to drive the array, so that each individual current source has longer to settle at a new current level after its control input has changed, so that more accurate (but slower settling) current sources can be used to provide higher accuracy of current control while still supporting higher switching frequencies.

In some cases, the current control circuitry may comprise two current sources. Alternatively, the current control circuitry may comprise three or more current sources. How many current sources are provided may depend on how long it takes a current source to settle at a new current level after an adjustment and on the desired switching frequency at which the current is to be switched for the selected column line.

The array may be provided with row select circuitry to select a selected row of resistive elements according to a row select signal switching at a given frequency. The timing control circuitry may be configured to switch between the plurality of current sources at said given frequency. During a period of the row select signal when a given row of resistive elements is selected by the row select circuitry, the current control circuitry may select a first of the current sources to supply current to a target resistive element in the given row of the selected column, and control a second of the current sources to adjust an amount of current supplied by the second of the current sources to correspond to a target current for a resistive element in a following row of the selected column. Hence, the current to be supplied to the next row in the column can be adjusted and settle during the period when the previous row is being driven by another current source.

Note that which direction of the array is regarded as a "row" and which direction is regarded as a "column" is essentially arbitrary—these terms are not being used to imply any absolute direction in which the array is oriented. Instead, "column" is simply being used to refer to the direction in which the resistive elements share the same current control line, with a "row" running in the orthogonal direction to a column.

In some implementations, each column may have a separate instance of the current control circuitry, so that each column is associated with two or more current sources controlled by the control circuitry. Alternatively, multiple columns could share the same current control circuitry and the associated current sources.

As well as controlling switching between the respective current sources, the switching circuitry may also be controlled by the timing circuitry to repeatedly switch the same current source in and out of the same column line over a period of time, before switching away to a different current source. For instance, the timing control circuitry may perform pulse width modulation of a switching signal for selecting whether a given one of the current sources is coupled to the selected column line. Hence, during a period when a given one of the plurality of current sources is designated for coupling to the selected column line, the timing control circuitry may perform pulse width modulation to select what fraction of said period said given one of the plurality of current sources is actually coupled to the selected column line by the current control circuitry. This can be useful because in some cases the current sources themselves may not provide as fine a degree of control of the amount of power delivered to a given resistive element as is desired for a given application. To provide finer control of the power delivered, pulse width modulation can be used to vary the total amount of time for which current is delivered to the resistive element.

This current control technique is particularly useful for an array in which each resistive element is arranged in series with a diode between the corresponding row line and the corresponding column line. For example the diodes may be provided to prevent formation of parasitic paths. When the diodes are provided, driving of the resistive elements in a given column with a current source may be preferred over a voltage source, since with voltage control the presence of the diode would introduce a temperature-dependent error into any desired setting for driving the resistive element. However, current sources are more difficult to switch fast and accurately as discussed above, and so the technique of providing multiple alternating current sources per column can help to increase switching rates without sacrificing accuracy.

In one example, each current source may comprise a closed-loop feedback circuit configured to control a voltage across a reference resistive element according to a reference voltage representing an amount of current to be supplied by that current source. Closed-loop control techniques provide a high degree of accuracy with which the current can be controlled to a given level, but are relatively slow to switch between different currents, so the technique discussed above enables such closed-loop current sources to be used with the resistive element array.

The current control circuitry may comprise a plurality of switching circuits each configured to selectively couple a corresponding one of the plurality of current sources to the selected column line, wherein each of the plurality of switching circuits is configured to select whether a current from the corresponding one of the plurality of current sources is directed to the selected column line or to a dummy load. By providing a dummy load for the switch to steer current into at times when the corresponding current source is not driving the column line, this allows current to flow during the settling period to enable the adjustment of the current level in time for the next time that current source is coupled to the column line.

This technique could be used in any array where current needs to be passed through a resistive element. However, it is particularly useful where the resistive elements comprise resistive heaters. For example, the array of resistive heaters may be for applying heat to a surface or liquid in a controlled pattern, with different temperatures being applied at different locations in the surface or the liquid.

A method of accurately measuring the resistance of the temperature sensor in the presence of an unknown voltage drop caused by a diode is described below. Although the magnitude of the voltage drop is not known, the logarithmic relationship between current and voltage drop is a general characteristic of all semiconductor devices. This property may be exploited to isolate the voltage drop across the resistor only, by measuring the combined voltage drop at multiple currents. A matrix of resistive temperature sensors can be accurately read using this technique. In one embodiment, a modified amplitude modulation approach can be used to reduce the specification of the analogue to digital converter used to convert the measured resistance to a digital binary value.

FIG. 1 shows an example of a matrix 2 of temperature sensors 4. Each temperature sensor 4 comprises a resistive element whose resistance varies in dependence on temperature. The matrix of temperature sensors may for example be used to provide a temperature map across a surface or within a liquid. However, if the number of temperature sensors 4 is large, it is generally not practical to provide separate electrical connections to each individual sensor 4, and so instead electrical connections can be shared between multiple devices. A matrix addressing scheme can be used, where each sensor 4 is provided at the intersection of a row line 6 and a column line 8, and any single device 4 is individually addressable by connecting an external circuit to its unique combination of row line 6 and column line 8. It will be appreciated that the matrix arrangement shown in FIG. 1 is a schematic diagram showing the electrical connections to each resistive element 4—although the actual resistive elements 4 provided in the circuit could be arranged in a corresponding grid pattern, this is not essential and other physical layouts could be used (e.g. the row and column lines may not be straight).

However, as shown in the left part of FIG. 1, if the resistive elements 4 are simply connected directly between the corresponding pair of row/column lines, when the switches for a selected column and row are closed, current may flow not only through the target element 4 at the intersection of the selected row and column, but also through parasitic paths flowing through other elements in neighbouring rows and columns, as indicated by the dotted line. These parasitic paths would prevent accurate measurement of the resistance (and hence temperature) at the target element. As shown in the right hand part of FIG. 1, diodes 10 can be connected in series with each resistive element 4 to prevent current flowing through the parasitic paths.

Figure 2:
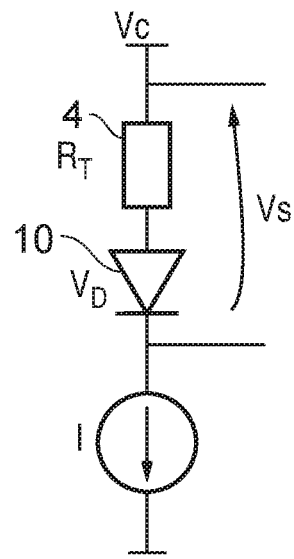
FIG. 2 illustrates how the presence of the diode affects the measurement of resistance of the resistive element.

However, the diode voltage introduces an error when attempting to measure resistance using a conventional circuit topology as shown in FIG. 2 where a current is supplied through the resistive element 4 and diode 10 and the combined voltage across the resistive element 4 and diode 10 is measured. Here, the resistance of the temperature sensor is $R_T$, the supply voltage is $V_C$, the measured voltage is $V_S$, and the voltage drop across the diode is $V_D$, and so:

$$V_S = R_T I + V_D$$

Thus, it is not possible to estimate $R_T$ from $V_S$ without an accurate knowledge of $V_D$.

$$R_T = \frac{V_S - V_D}{I}$$

The magnitude of the uncertainty depends on the relative size of the diode drop and the drop across the resistor. The diode drop may be of the order of several hundred millivolts, whilst the absolute size of voltage drop that can be imposed across the resistor is limited to a few Volts at most by the need to limit power dissipation in the temperature sensor. Temperature measurement with precision of fractions of a degree would typically therefore require measurement of the resistor voltage with precision of fractions of a millivolt. To make matters worse, the diode voltage is itself temperature dependent:

$$V_D = \frac{kT}{q} \ln\left(\frac{I}{I_S} + 1\right)$$

where k is Boltzmann constant ($1.38 \times 10^{-23}$ JK$^{-1}$), q is the electronic charge ($1.6 \times 10^{-19}$ C) and T is the absolute temperature (° K). The saturation current, $I_S$, is a device specific term that has its own temperature dependence, as well as long term drift.

Figure 3:
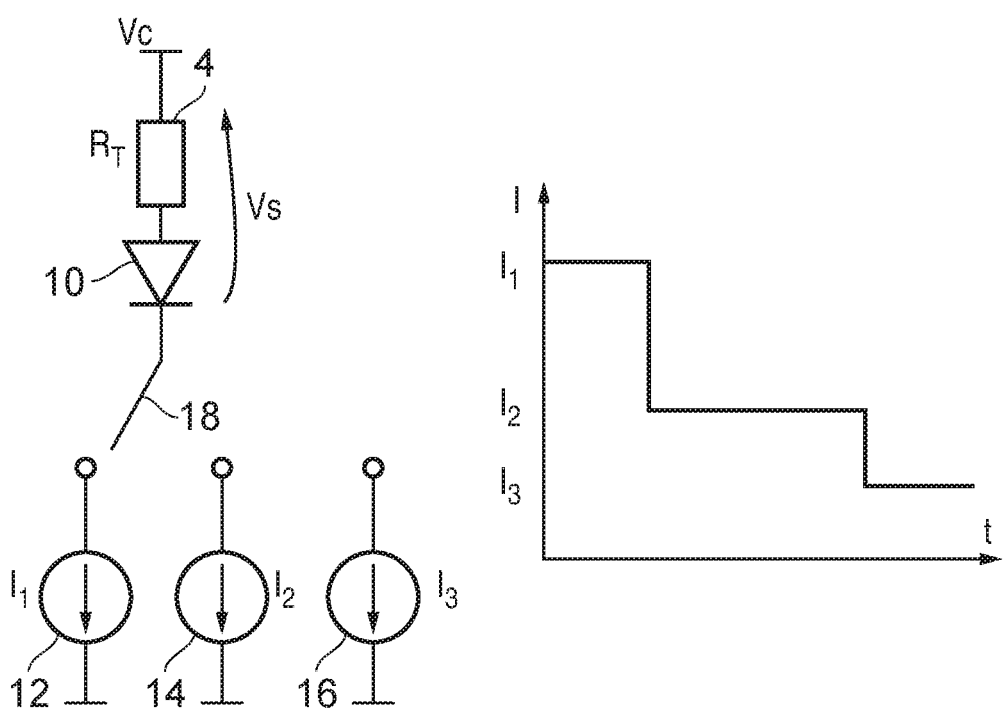
FIG. 3 illustrates measurement of the resistance of the diode to eliminate the influence of the voltage across the diode.

The measurement can be made independent of the diode voltage drop by alternately imposing three different currents, $I_1$, $I_2$, and $I_3$ using respective current sources 12, 14, 16 as shown in FIG. 3 whose relative sizes are determined by the relationship $$\frac{I_1}{I_2} = \frac{I_2}{I_3},$$

where $I_2 = yI_1$, $I_3 = y^2 I_1$, and $1 > y > 0$.

The current sources 12, 14, 16 and switching circuitry 18 for selecting which of the current sources is connected to the resistive element 4, 10 may collectively be considered as current control circuitry. While FIG. 3 shows a single "cell" of the array shown in FIG. 1 for conciseness, it will be appreciated that in the array embodiment of FIG. 1 the current control circuitry may be shared among all the elements in the same column, with the row selection determining which particular element is coupled to the current control circuitry.

Differential measurements can be taken between the voltages generated at $I_1$ and $I_2$, and $I_2$ and $I_3$ respectively:

$$\Delta V_{S1,2} = V_1 - V_2 = R_T(I_1 - I_2) + \frac{kT}{q} \ln\left(\frac{I_1}{I_2}\right)$$

$$\Delta V_{S2,3} = V_2 - V_3 = R_T(I_2 - I_3) + \frac{kT}{q} \ln\left(\frac{I_2}{I_3}\right)$$

which eliminates the effect of the saturation current $I_S$. As the ratio between the currents $I_1$ and $I_2$ is the same as the ratio between currents $I_2$ and $I_3$, $$\frac{kT}{q} \ln\left(\frac{I_1}{I_2}\right) = \frac{kT}{q} \ln\left(\frac{I_2}{I_3}\right),$$

and so subtracting the differential voltages $\Delta V_{S1,2}$ and $\Delta V_{S2,3}$ produces a value proportional to $R_T$ and independent of the diode:

$$\Delta V_S = \Delta V_{S1,2} - \Delta V_{S2,3} = V_1 - 2V_2 + V_3 = R_T I_1 (1-y)^2$$

Therefore, by applying the three currents having the relation discussed above, and measuring $V_1 - 2V_2 + V_3$, the resulting value is proportional to the resistance $R_T$ of the temperature sensor 4, and hence to temperature T.

In practice, the diode voltage will not completely cancel out due to the finite tolerance to which the current ratio can be held, and because a real diode does not perfectly match the model used here (Ebers-Moll) across its entire current range. Hence, the effect of the diode may only be partially eliminated. Nevertheless, any resulting imperfection will be orders of magnitude smaller than a single ended or differential diode drop relative to the desired signal. This enables the resistance measurement to be made accurately with moderate voltage drops and therefore low power dissipation in the sensor itself.

One effect of this technique is that the resolution to which $\Delta V_S$ should be measured is increased by comparison to the simple single-ended case. This is because of two effects:
1) The signal containing information has been reduced by a factor of $(1-y)^2$ by comparison to the overall measurement dynamic range
2) Three measurements are made instead of one, increasing any quantisation noise relative to the signal by around 0.8 bit.

These effects result in an increased number of bits of resolution, given by $$\text{bits} \approx \text{bits}_{single-ended} + \frac{-2\ln(1-y)}{\ln(2)} + 0.8$$

It is therefore advantageous to avoid values of y close to unity (similar currents) in order to avoid a large increase in the necessary resolution, although widely varying currents will decrease the degree to which the diode drop will cancel out due to non-ideal behaviour of the diode. Hence, in some embodiments, it may be preferable for y to be "near the middle" of the range 0 to 1. For example, if $0.25 < y < 0.75$, then this may provide a better balance between the resolution required and the extent to which the diode voltage drop is eliminated.

Figure 4:
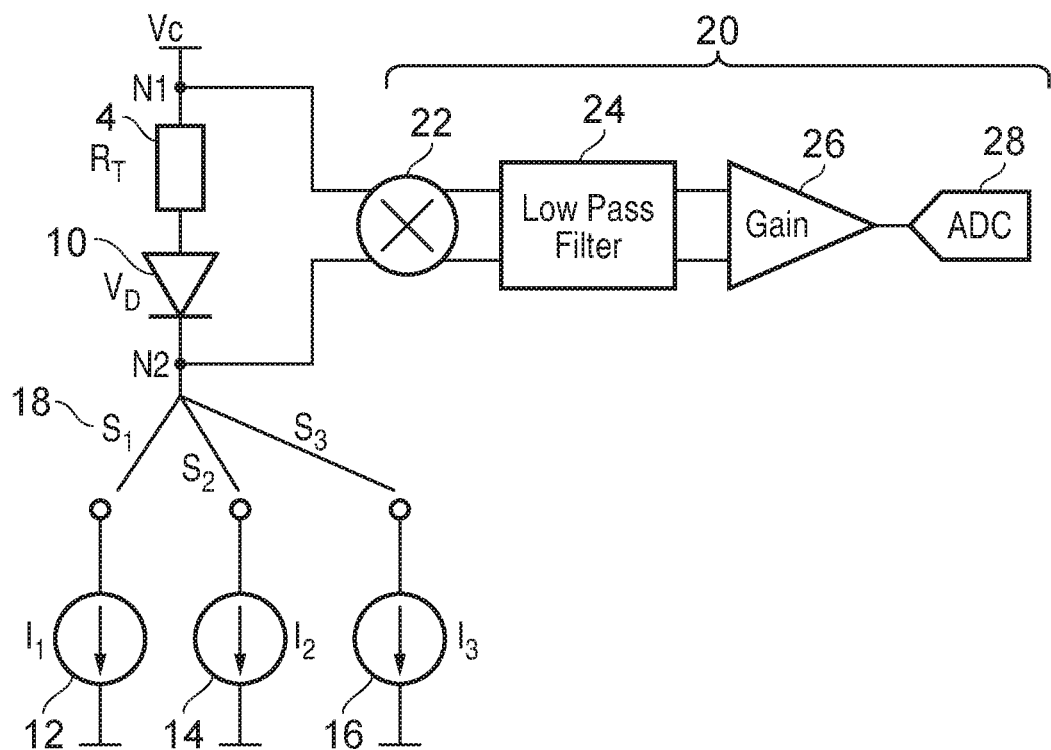
FIG. 4 shows an example embodiment of a modulating scheme topology for measuring the resistance of the resistive element.

One way to improve this situation and to reduce the resulting specification of any analogue to digital converter is to use a custom form of amplitude modulation as shown in FIG. 4. In this example, the measuring circuitry 20 for measuring the voltage across the resistive element 4 and diode 10 comprises switch 22, a low pass filter 24, an amplifier 26 providing gain, and an analogue-to-digital converter (ADC) 28. The low pass filter 24 is a differential filter acting as an integrator, receiving a differential pair of inputs and outputting a differential pair of outputs whose value represents the integral of the signals received at the inputs over a period of time. The amplifier 26 applies gain and resolves the differential inputs to a single-ended analogue signal, and the ADC 28 converts the single-ended signal to a digital value. The inputs of the low pass filter 24 are connected to signal nodes N1, N2 on either side of the resistive element 4 and diode 10. The switch 22 is provided to selectively reverse the polarity of the signal provided to the low pass filter 24. For example, the switch 22 may be a crossbar switch which switches which of the inputs of the low pass filter 24 is connected to node N1 and which is connected to node N2. The demodulator can be implemented as a simple cross-point switch, provided that the low-pass filter stage that follows it is fully differential. This approach avoids accumulation of errors due to charge injection at the switches, as the symmetrical nature of the scheme causes any errors to cancel over the course of the switching waveform.

With this arrangement, if the currents $I_1$, $I_2$, $I_3$ are switched at a frequency greater than the desired measurement bandwidth (sampling rate of the ADC), then a differential demodulator may be used to both perform the differencing necessary to remove the diode drop, and to mix the measurement information down to DC, so that the resistance $R_T$ can be measured within a single sampling period of the ADC, with only a single A/D conversion, to reduce the amount of quantisation noise.

Figure 5:
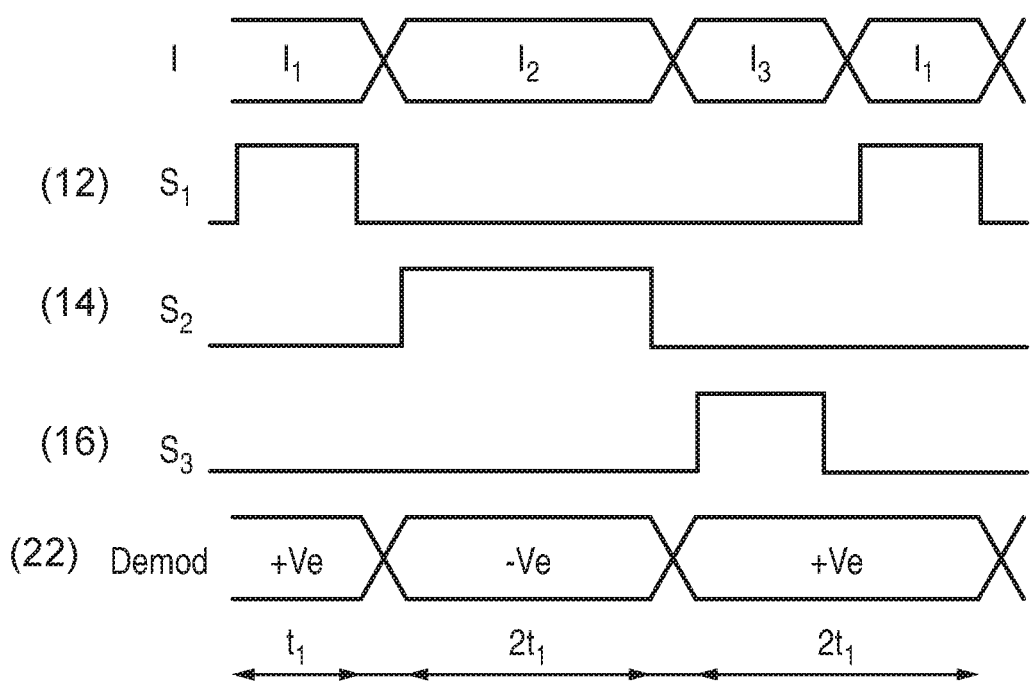
FIG. 5 shows waveforms for controlling the modulating scheme.

In order to provide the desired relation of $R_T$ as discussed above, the switching waveforms for the current sources 12, 14, 16 and switch 22 are arranged as shown in FIG. 5 such that the low-pass filter 24 averages the voltages to give:

$$V_{LPF} = \frac{1}{T}\int_0^T V_1 - 2V_2 + V_3 dt$$

Hence, the current $I_2$ is imposed for twice as long as either $I_1$ or $I_3$, and the switch 22 has the opposite polarity when current $I_2$ compared to when current $I_1$ or $I_3$ is supplied. The filter may be designed to provide sufficient rejection of the switching frequencies of $I_{1/3}$ and $I_2$. The output of the filter is therefore the desired resistor drop eliminating (or partially eliminating) the effect of the diode. Although the output of the low pass filter is smaller than the signal from the simple single-ended case, the dynamic range has been reduced. Gain can therefore be applied, and an analogue to digital converter can be used with a resolution no greater than would be require for a simple measurement without the diode.

Figure 6A:
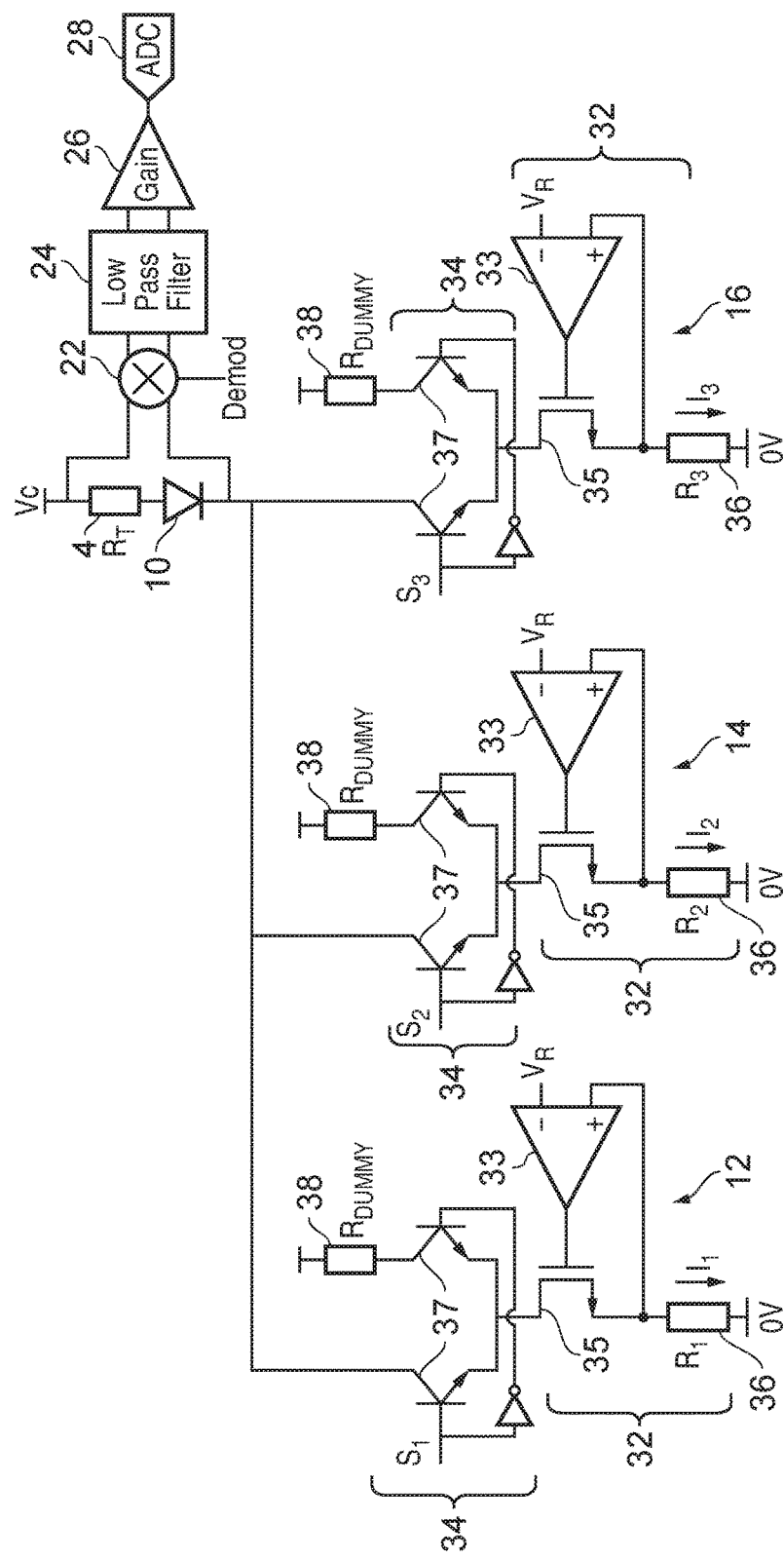
FIG. 6A shows a more detailed example embodiment of current control circuitry for controlling the current across the resistive element and diode.

One possible circuit implementation of this scheme is shown in FIG. 6A. The measuring circuitry 20 is still as shown in FIG. 4. FIG. 6A shows the current control circuitry in more detail. To provide more accurate current control to increase the extent to which the diode drop voltage cancels from the measured value, the current sources can be implemented using closed-loop techniques with a common reference voltage. Fast switching can be achieved without the need for these closed-loop current sources to have high bandwidth by using a differential pair of transistors that steers the current either through the load or through a dummy load; in this way each closed-loop current source provides a constant current across the entire switching waveform.

Hence, each current source 12, 14, 16 comprises a closed-loop feedback circuit 32 and a switching circuit 34. Each closed-loop feedback circuit 32 comprises a differential amplifier 33 and transistor 35 to maintain the voltage across a reference resistor 36 at a common reference voltage $V_R$ which is the same for all three of the current sources 12, 14, 16. The reference resistor 36 in each current source 12, 14, 16 has a different resistance $R_1$, $R_2$, $R_3$ so that the ratios between the reference resistances define the ratios between the currents as discussed above. Each switching circuit 34 includes a pair of differential transistors 37, which may be FETs or bipolar transistors (FIG. 6A shows an example with bipolar transistors). The switching transistors 37 are controlled by the corresponding one of the switching waveforms $S_1$, $S_2$, $S_3$ as shown in FIG. 5. When the switching waveform is high, the current from the corresponding feedback circuit 32 is supplied to the resistive element 4 and diode 10. When the switching waveform is low, the current from the feedback circuit 32 is routed to a dummy load 38. It will be appreciated that the example of FIG. 6A is just one embodiment of how the resistance $R_T$ can be measured.

Figure 6B:
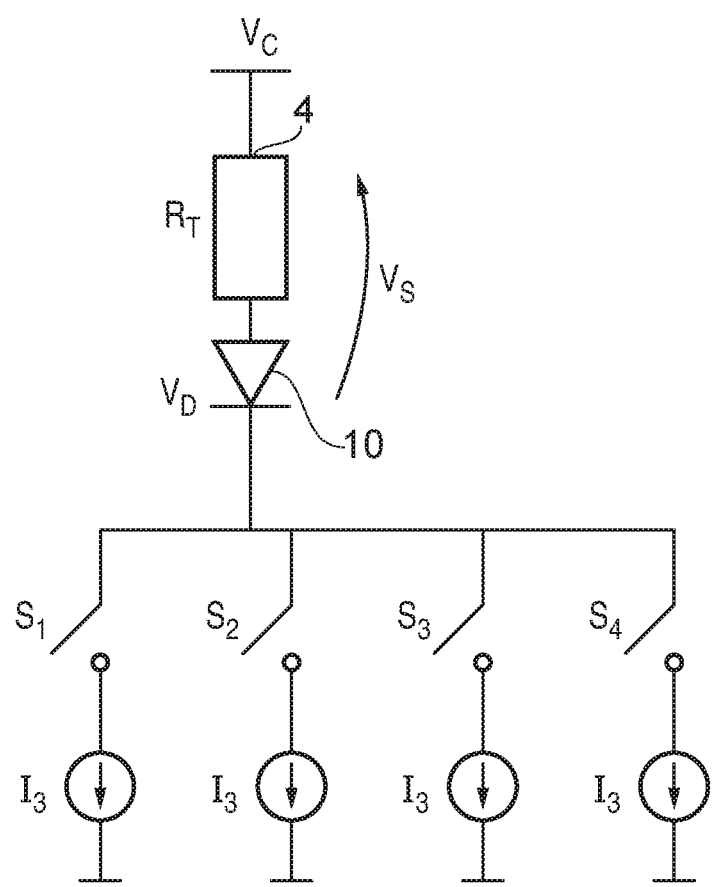
FIG. 6B shows an example embodiment for control of current supplied to the resistive element and diode.

In one example, the common ratio y between the currents is 0.5, and so $I_1=4I_3$ and $I_2=2I_3$. As shown in FIG. 6B, when y=0.5, the currents $I_1$, $I_2$, and $I_3$ can be created from a selective combination of 4 current sources 40 each of magnitude $I_3$. The current control circuitry may comprise switching circuitry $S_1$-$S_4$ for switching how many of the 4 current sources are coupled to the resistive element 4 and diode 10. All 4 current sources may be coupled to the resistive element 4 and diode 10 when current $I_1$ is to be supplied, 2 of the current sources may be coupled to the resistive element 4 and diode 10 when current $I_2$ is to be supplied, and 1 of the current sources may be coupled to the resistive element 4 and diode 10 when current $I_3$ is to be supplied. An advantage of this embodiment is that measurement performance, in terms of cancelation of diode voltage, can be improved by tuning the four current source outputs to be the same in magnitude, which is a simpler process than calibrating the current sources to a plurality of predetermined current magnitudes.

Figure 7:
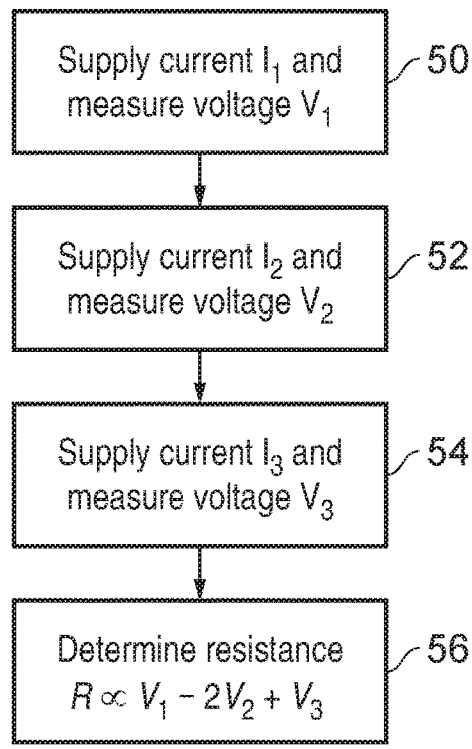
FIG. 7 is a flow diagram showing a method of measuring a resistance of the resistive element in the presence of a series diode.

FIG. 7 is a flow diagram illustrating a method of measuring a resistance R of a resistive element 4 with reduced dependency on the voltage drop through a series diode 10. At step 50, a first current $I_1$ is supplied to the resistive element 4 and diode 10, and a first voltage $V_1$ is measured across the resistive element 4 and diode 10. Similarly, at steps 52 and 54, further voltages $V_2$ and $V_3$ are measured across the resistive element 4 and diode 10 when second and third currents $I_2$ and $I_3$ are supplied respectively. It will be appreciated that it is not essential for the voltages to be measured in the order $V_1$, $V_2$, $V_3$ as shown in FIG. 7—any arbitrary order would work. At step 56, the resistance R of the resistive element 4 is determined proportional to $V_1-2V_2+V_3$. It will be appreciated that the absolute value of the resistance R does not need to be determined. For example, when using the resistive elements as temperature sensors, it can be enough that a value proportional to R is determined, which following calibration can be mapped to temperature.

Figure 8:
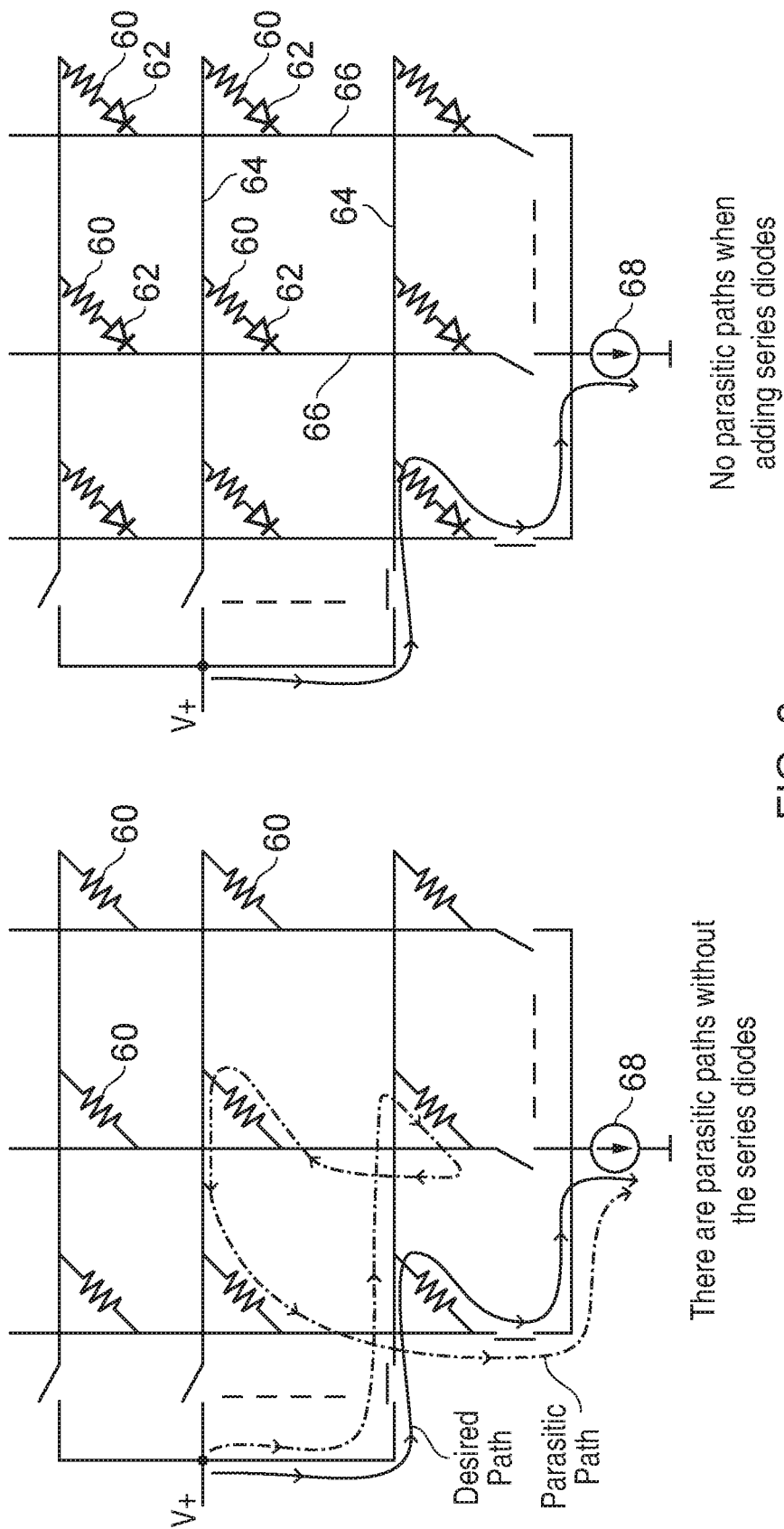
FIG. 8 shows an example of an array of resistive heaters.

As shown in FIG. 8, a matrix of resistive heaters 60 can be used to apply heat to a surface or liquid in a controlled pattern. Electrical connection of multiple heaters can be facilitated by series diodes 62, which enable a row/column addressing scheme to be used without introducing parasitic paths. Hence, there are a number of row lines 64 and column line 66, and at each intersection a resistive heater 60 is connected in series with a diode 62 between the corresponding pair of row/column lines 64, 66. Current can be driven into a selected heater 60 by coupling a current source 68 to the corresponding column line 66 and applying a voltage V+ to the corresponding row line 64. A current source 68 is used as the diodes 62 introduce errors in the amount of heat produced when driven by a voltage source particularly in the case of low-power devices where the diode voltage drop can be significant. Using current drive 68 removes these errors, but it can be difficult to design current sources that can cope with the high switching rates needed for large numbers of heaters when different heaters need to be provided with different amounts of current.

The technique discussed below provides a circuit topology that enables a large matrix of resistive heaters to be current driven, resulting in accurate control of the power delivered to each heater element. This is achieved by combining a pair of active current sources with a fast switching array to create a compound current source. This circuit is capable of delivering current to one element of the resistive matrix whilst preparing itself to deliver current to the next element, resulting in very fast switching times whilst maintaining accurate current control. This scheme can be combined with pulse-width-modulation approaches in order to provide very precise control of the delivered power.

In one particular embodiment, the compound current source can be implemented using closed-loop current sources constructed by FETs and op-amps, combined with fast differential-pair switches. Dummy loads can be used to enable each current source to fully settle before it is switched into a matrix element.

Figure 9:
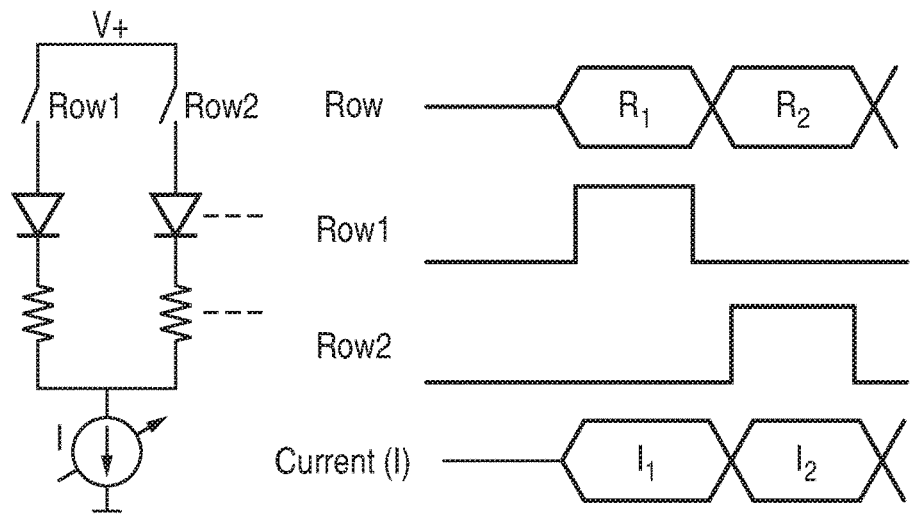
FIG. 9 shows a comparative example for controlling current supplied for a column of resistive heaters.

In order to create a large matrix of heaters it is often most practical to share electrical connections between multiple devices. The most common scheme is matrix addressing, where a single device is selected by connecting an external circuit to its unique combination of row and column. Although this drastically reduces the number of necessary connections, series diodes are required to prevent current flowing through parasitic paths as mentioned above. If the heaters are driven by simple voltage control (or pulse-width-modulation of a fixed voltage) then the diode voltage drop introduces a temperature-dependent error into any desired power setting. This can become highly significant for miniaturised heaters, where the diode voltage drop can be comparable to the desired average voltage drop across the heater element. Replacing each column switch to ground with a current source 68 improves the accuracy, because the power in the resistive elements is then independent of the diode characteristics. However, these current sources have to be capable of quickly changing the current drive in order for an individual column source to deliver different power levels to each element in that column, as shown in FIG. 9. This makes it difficult to use high accuracy closed-loop current sources, which require significant time to settle after any change in demanded current.

Figure 10:
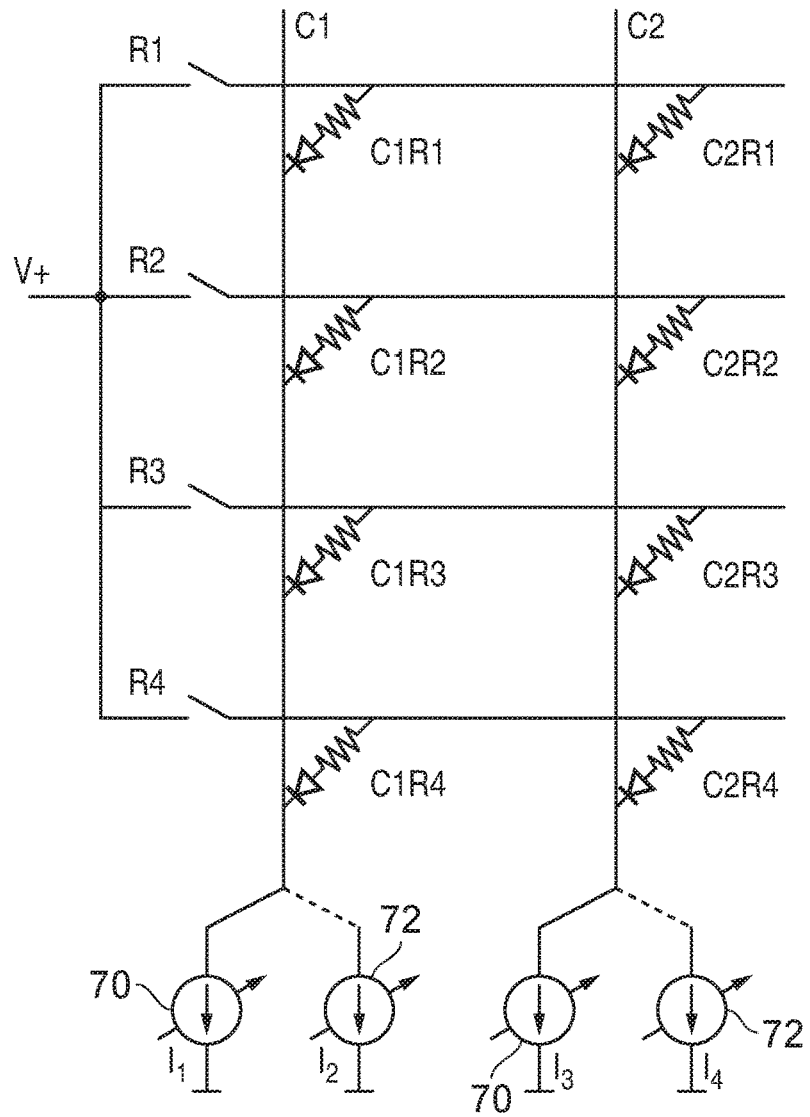
FIG. 10 shows an example in which a pair of current sources are provided for each column to enable faster switching of the current supplied to the column.
Figure 11:
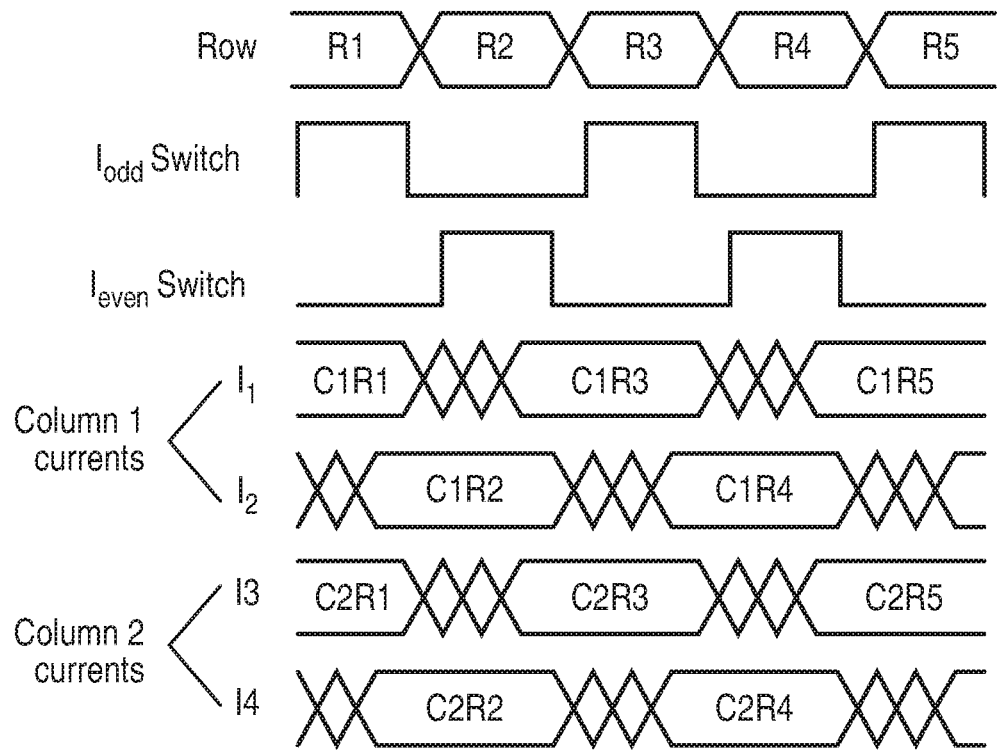
FIG. 11 is a timing diagram indicating the control of the current sources for each column.

Instead of using a single current source for each column, a pair of current sources 70, 72 per column can be combined with a fast switching array as shown in FIG. 10. The two current sources are used to drive alternate elements, such that each current source is driving the array for half of the time. The time period when a current source is not being used to drive the array can therefore be used to alter the current to the correct level for the next element. In this way, the individual current sources have a relatively long time to change their current drive level, enabling accurate closed-loop sources to be used. The principle is shown in the timing diagram of FIG. 11, showing each current source alternating between driving the array and changing its current drive level ready for the next time period.

Although the invention could be implemented using a variety of current sources, a benefit is that closed-loop techniques, which settle slowly but offer high accuracy, can be used. Hence, a dummy path is provided for current to flow during the settling period. This can be achieved using a differential pair, which results in a fast switching speed. Although FETs can be used to create these switches, avoiding the base current errors of bipolars, it is advantageous to use transistors that create an effective cascode (i.e. bipolars or FETs with a high transconductance). That is because the differential pair holds the voltage at the output of the closed-loop current source constant, increasing the effective output impedance of the compound current source.

Figure 12:
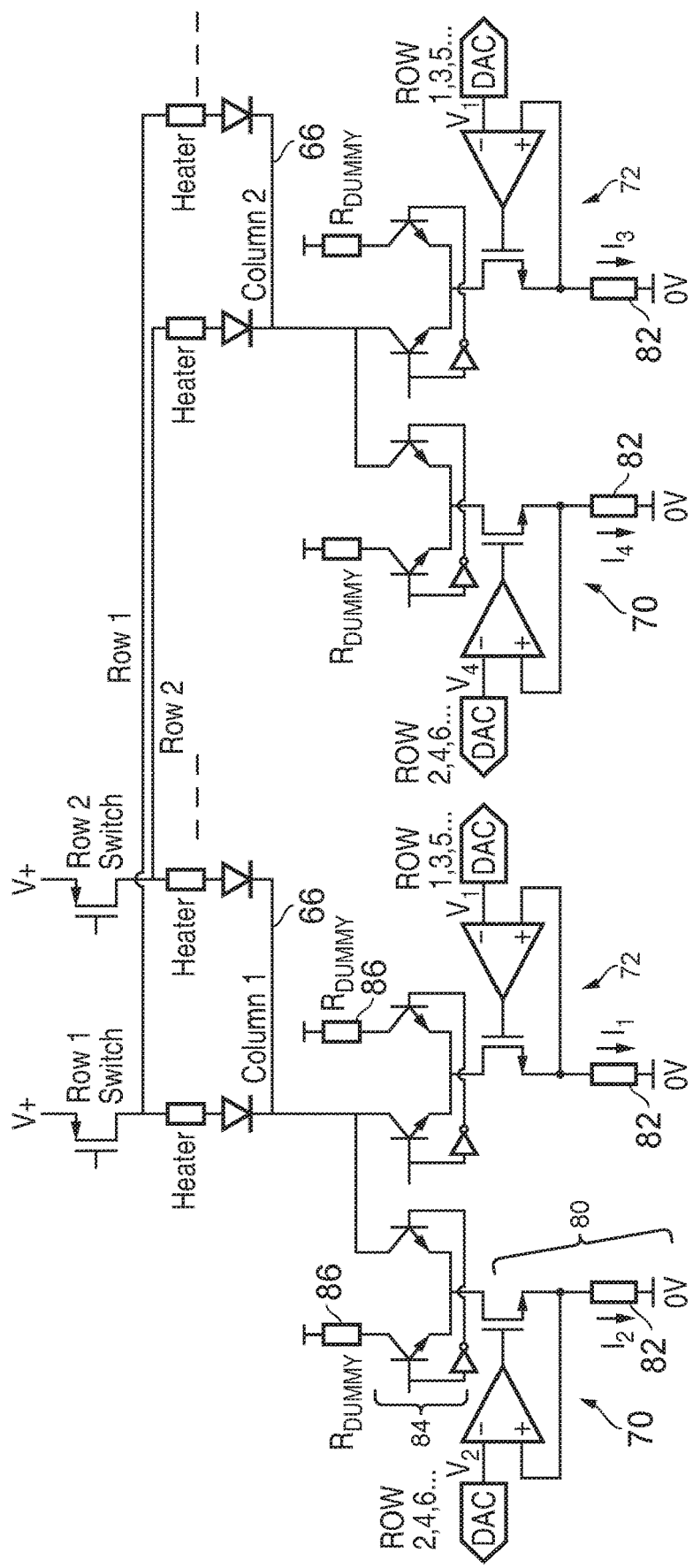
FIG. 12 shows an example embodiment of the current control circuitry in more detail.

FIG. 12 shows the current control circuitry for switching the current between the respective current sources 70, 72 in more detail. Each current source 70, 72 is similar to the arrangement shown in FIG. 6 above, comprising a closed-loop feedback circuit 80 maintaining a voltage across a reference resistor 82 according to a specified reference voltage V. However, unlike in FIG. 6, in which a common reference voltage is used for all current sources, in FIG. 12 specified target voltages $V_1$-$V_4$ are set for each current source 70, 72 according to the desired power setting for the corresponding heater 10 to be controlled. The reference resistors 82 may have the same resistance for all the current sources 70, 72, so that the current supplied is controlled solely by the target voltages $V_1$-$V_4$, which may be specified by a digital-to-analogue converter (DAC). Also, each current source 70, 72 has a corresponding switching circuit 84 which selects whether that current source is coupled to the corresponding column line 66. Each switching circuit 84 comprises a complimentary pair of switching transistors which selects whether the current from that current source is directed to the corresponding column line 66 or to a dummy load 86. In the embodiment of FIG. 12, the pair of current sources 70, 72 corresponding to the same column have the dummy load 86 connected to opposite sides of the switching transistors (with the column line 66 connected to the other side to the dummy load 86). This means a single switching waveform can be applied to the switching circuits 86 in both current sources to select which current source is supplying current to the corresponding column, eliminating the need for a second switching waveform as shown in FIG. 11.

Figure 13:
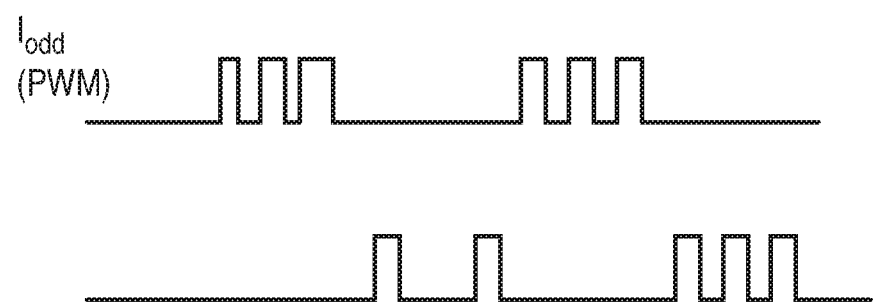
FIG. 13 shows an example of using pulse width modulation to control the power delivered to a resistive element.

Alternatively, other embodiments may still use two switching waveforms per column, one for each current source 70, 72. One advantage of this is that pulse width modulation can be used as shown in FIG. 13 to adjust the amount of time for which power is delivered to a particular resistive heater even during periods when a particular one of the current sources is selected for coupling to the column line 66. Because of the increased time available for settling achieved by providing multiple current sources per column, the current drive level can be set with a voltage (or resistive) DAC by a processor or other digital circuit, which ensures that the current sources track each other and can be adjusted with high precision. Even so, the resolution of current control available may not be enough for some applications where it is desirable to provide very fine adjustment of the power in each element. In that case, the switches can be used to pulse-width modulate the current by restricting the time that each source is coupled to the array. The overall resolution is then the combination of the resolution of the current source and the pulse-width modulation scheme. As shown in FIG. 13, the fraction of the time when a particular current source is actually used for delivering power to a given row can be varied from row to row within the same column (e.g. for the even numbered rows the example of FIG. 13 shows a case where the first selected row receives less power than the next selected row).

Figure 14:
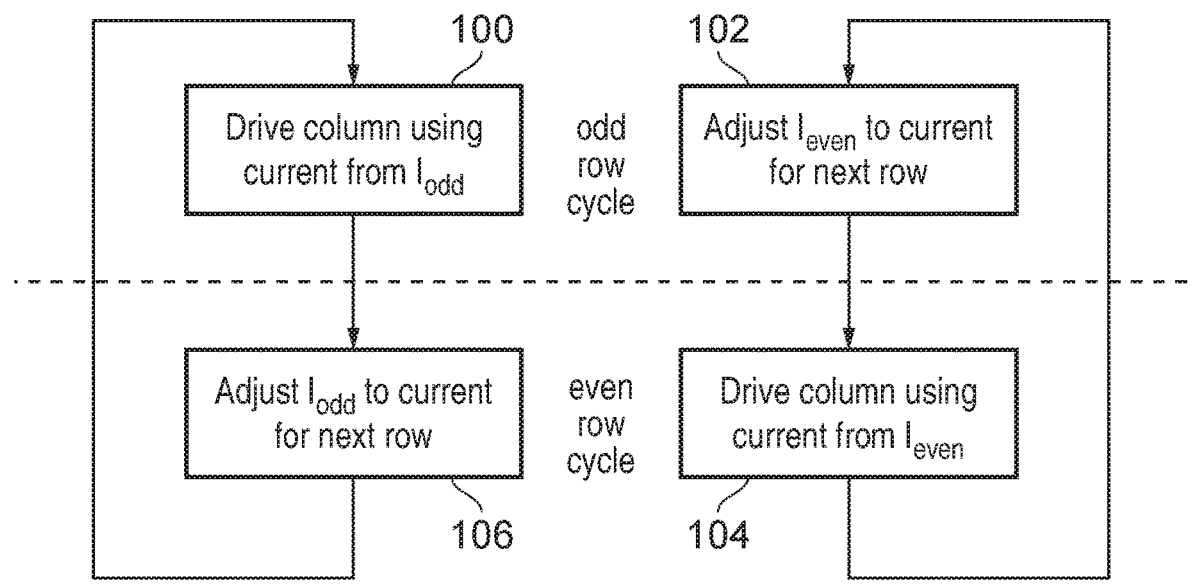
FIG. 14 is a flow diagram illustrating a method of controlling current supply for an array of resistive elements.

FIG. 14 is a flow diagram showing a method of controlling supply of current to an array of resistive elements. During a cycle in which an odd-numbered row of the array is selected, at step 100 a given column of the array is driven with current supplied from a first current source ($I_{odd}$), while meanwhile at step 102 a second current source ($I_{even}$) for the same column has its control voltage adjusted to adjust the level of current to be supplied to the even-numbered row to be selected in the following cycle. The current supplied by the second current source settles before the end of the cycle. In a following even row cycle when an even-numbered row of the array is selected, at step 104 the second current source is used to drive the column, while at step 106 the first current source is adjusted to provide the current level required for the following odd row cycle. The method then returns to steps 100 and 102 for the following odd row cycle. FIG. 14 shows the steps performed for a single column, but the same method may be performed in parallel in each column of the array. While the examples above show a case where one column is provided with a pair of current sources, it will be appreciated that in other examples three or more current sources could be provided per column to enable even faster switching between rows.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

The invention claimed is:

1. An apparatus comprising:
a resistive element and a diode arranged in series;
current control circuitry configured to switch a current supplied to the resistive element and the diode between a first current $I_1$, a second current $I_2$ and a third current $I_3$, where $I_1>I_2>I_3$; and
measuring circuitry configured to determine a resistance R of the resistive element in dependence on a first voltage $V_1$ across the resistive element and the diode when the first current $I_1$ is supplied, a second voltage $V_2$ across the resistive element and the diode when the second current $I_2$ is supplied, and a third voltage $V_3$ across the resistive element and the diode when the third current $I_3$ is supplied;
wherein the measuring circuitry is configured to combine the first voltage $V_1$, the second voltage $V_2$ and the third voltage $V_3$ to at least partially eliminate an error in the determined resistance R of the resistive element caused by a voltage drop across the diode;
wherein the resistive element is one of an array of resistive elements arranged in rows and columns, wherein each resistive element is individually addressable via a corresponding row line and a corresponding column line and is arranged in series with a diode between the corresponding row line and the corresponding column line.

2. The apparatus according to claim 1, wherein a ratio between the first current $I_1$ and the second current $I_2$ is substantially the same as a ratio between the second current $I_2$ and the third current $I_3$.

3. The apparatus according to claim 1, wherein the measuring circuitry is configured to determine the resistance R of the resistive element proportional to $V_1-2V_2+V_3$.

4. The apparatus according to claim 1, wherein the measuring circuitry comprises an analogue-to-digital converter configured to generate a digital value representing the determined resistance R of the resistive element in dependence on the first voltage $V_1$, second voltage $V_2$, and third voltage $V_3$ detected during a single sampling period of the analogue-to-digital converter.

5. The apparatus according to claim 1, wherein the measuring circuitry comprises a filter configured to receive a pair of differential inputs indicative of the voltage across the resistive element and the diode and to generate an output signal representing an integral of the voltage represented by the differential inputs over time.

6. The apparatus according to claim 5, comprising a switch configured to select one of a first configuration and a second configuration in which a polarity of the pair of differential inputs of the filter is reversed compared to the first configuration.

7. The apparatus according to claim 6, comprising timing control circuitry configured to control the switch to select the first configuration when the first current $I_1$ or the third current $I_3$ is supplied to the resistive element and the diode, and to select the second configuration when the second current $I_2$ is supplied to the resistive element and the diode.

8. The apparatus according to claim 5, comprising timing control circuitry configured to control the current control circuitry to supply the first current to the resistive element and the diode in a first time period of duration t, to supply the second current to the resistive element and the diode in a second time period of duration 2 t, and to supply the third current to the resistive element and the diode in a third time period of duration t.

9. The apparatus according to claim 5, wherein the measuring circuitry comprises an analogue-to-digital converter configured to generate a digital value representing the resistance R of the resistive element in dependence on the output signal of the filter;
comprising timing control circuitry configured to control the current control circuitry to switch between the first current, the second current and the third current at a greater frequency than a sampling rate of the analogue-to-digital converter.

10. The apparatus according to claim 1, wherein the current control circuitry comprises a first current source to generate the first current $I_1$, a second current source to generate the second current $I_2$, and a third current source to generate the third current $I_3$.

11. The apparatus according to claim 1, wherein the current control circuitry comprises four current sources each to generate a current with a magnitude corresponding to the third current $I_3$, and switching circuitry to vary how many of the four current sources are coupled to the resistive element and the diode, to switch the current supplied to the resistive element and the diode between the first current $I_1$, the second current $I_2$ and the third current $I_3$.

12. The apparatus according to claim 1, wherein the resistive element comprises a temperature sensor and the resistance R is indicative of temperature.

13. A method for measuring a resistance R of a resistive element arranged in series with a diode; the method comprising:
switching a current supplied to the resistive element and the diode between a first current $I_1$, a second current $I_2$ and a third current $I_3$, where $I_1>I_2>I_3$; and determining the resistance R of the resistive element in dependence on a first voltage $V_1$ across the resistive element and the diode when the first current $I_1$ is supplied, a second voltage $V_2$ across the resistive element and the diode when the second current $I_2$ is supplied, and a third voltage $V_3$ across the resistive element and the diode when the third current $I_3$ is supplied;

wherein the resistance R is determined by combining the first voltage $V_1$, the second voltage $V_2$ and the third voltage $V_3$ to at least partially eliminate an error in the determined resistance R of the resistive element caused by a voltage drop across the diode;

wherein the resistive element is one of an array of resistive elements arranged in rows and columns, wherein each resistive element is individually addressable via a corresponding row line and a corresponding column line and is arranged in series with a diode between the corresponding row line and the corresponding column line.

* * * * *